US006576934B2

(12) United States Patent
Cheng et al.

(10) Patent No.: US 6,576,934 B2
(45) Date of Patent: Jun. 10, 2003

(54) EMBEDDED SCR PROTECTION DEVICE FOR OUTPUT AND INPUT PAD

(75) Inventors: Tao Cheng, Kanshang (TW); Jian-Hsing Lee, Hsin-Chu (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 10/278,135

(22) Filed: Oct. 22, 2002

(65) Prior Publication Data

US 2003/0038298 A1 Feb. 27, 2003

Related U.S. Application Data

(62) Division of application No. 09/671,214, filed on Sep. 28, 2000, now Pat. No. 6,492,208.

(51) Int. Cl.$^7$ ............................................. H01L 29/74
(52) U.S. Cl. ..................... 257/107; 257/355; 257/356; 257/141; 257/173; 257/175; 438/133; 438/134; 438/135; 438/140; 438/223; 361/56
(58) Field of Search ................................. 257/107, 356, 257/355, 141, 173, 175; 438/133–135, 140, 223; 361/56

(56) References Cited

U.S. PATENT DOCUMENTS

| 5,754,381 A | * | 5/1998 | Ker ............................... 361/56 |
| 5,856,214 A | | 1/1999 | Yu ............................... 438/133 |
| 5,872,379 A | | 2/1999 | Lee ............................... 257/355 |
| 5,907,462 A | * | 5/1999 | Chatterjee et al. ............. 361/56 |
| 5,939,756 A | * | 8/1999 | Lee ............................... 257/355 |
| 5,959,820 A | * | 9/1999 | Ker et al. ....................... 361/111 |

OTHER PUBLICATIONS

"A Low–Voltage Triggering SCR for On–Chip ESD Protection at Output and Input Pads," A. Chatterjee and T. Polgreen, IEEE Electron Device Letters, vol. 12, No. 1, Jan. 1991, pp. 21–22.
"Lateral SCR Devices with Low–Voltage High–Current Triggering Characteristics for Output ESD Protection in Submicron CMOS Technology," Ker, IEEE, Trans. On Electron Devices, vol. 45, No. 4, Apr. 1998, pp. 849–860.

* cited by examiner

Primary Examiner—Nathan J. Flynn
Assistant Examiner—Remmon R. Fordé
(74) Attorney, Agent, or Firm—George O. Saile; Stephen B. Ackerman

(57) ABSTRACT

An embedded SCR in conjunction with a Gated-NMOS is created for protecting a chip input or output pad from ESD, by inserting a p+ diffusion and the n-well in the drain side and a part of the drain to forms a low-trigger, high efficiency SCR. The device layout is such that the drain connection is tightly tied together at the p+ diffusion and the n+ drain making that connection very short and, thereby, preventing latch-up. The parasitic SCR is contained entirely within the n+ diffusion (the source of the grounded gate NMOS transistor) at either side of the structure and, therefore, called an embedded SCR. For a 12 volt I/O device each of two n+ drains is placed in its own n-type doped drain (ndd) area straddling halfway the n-well. The structure is repeated as required and a p+ diffusion is implanted at both perimeters and connected to the nearest n+ source and a reference voltage.

11 Claims, 7 Drawing Sheets

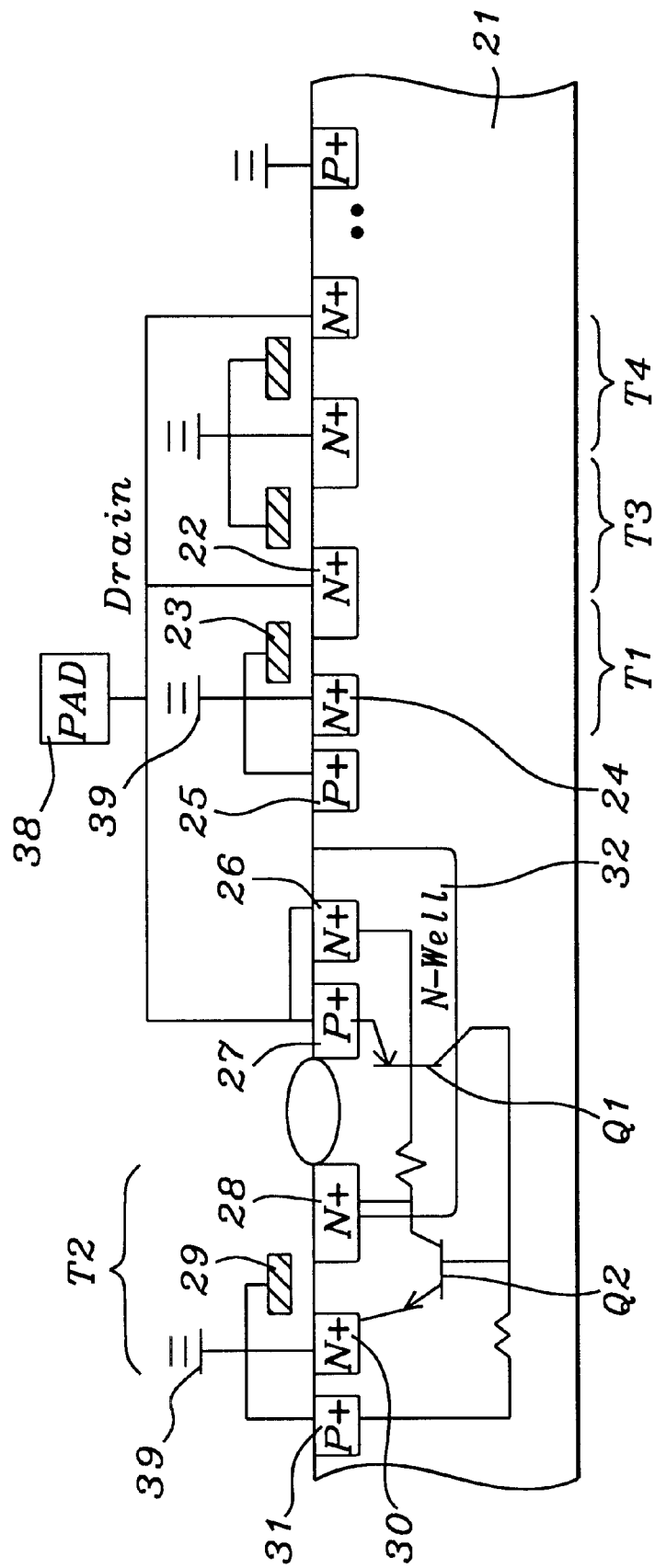
FIG. 2 – Prior Art

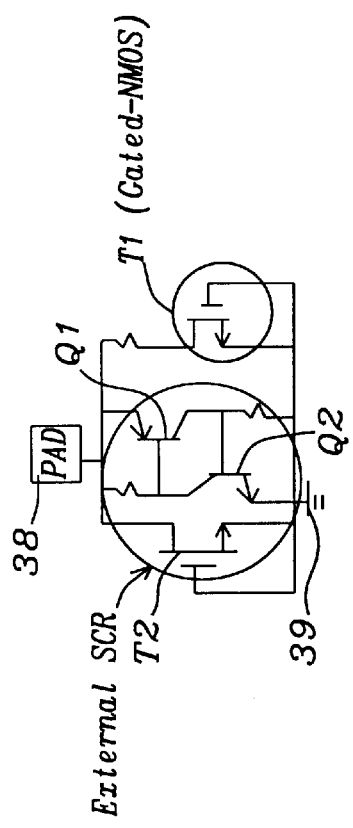
FIG. 3 – Prior Art
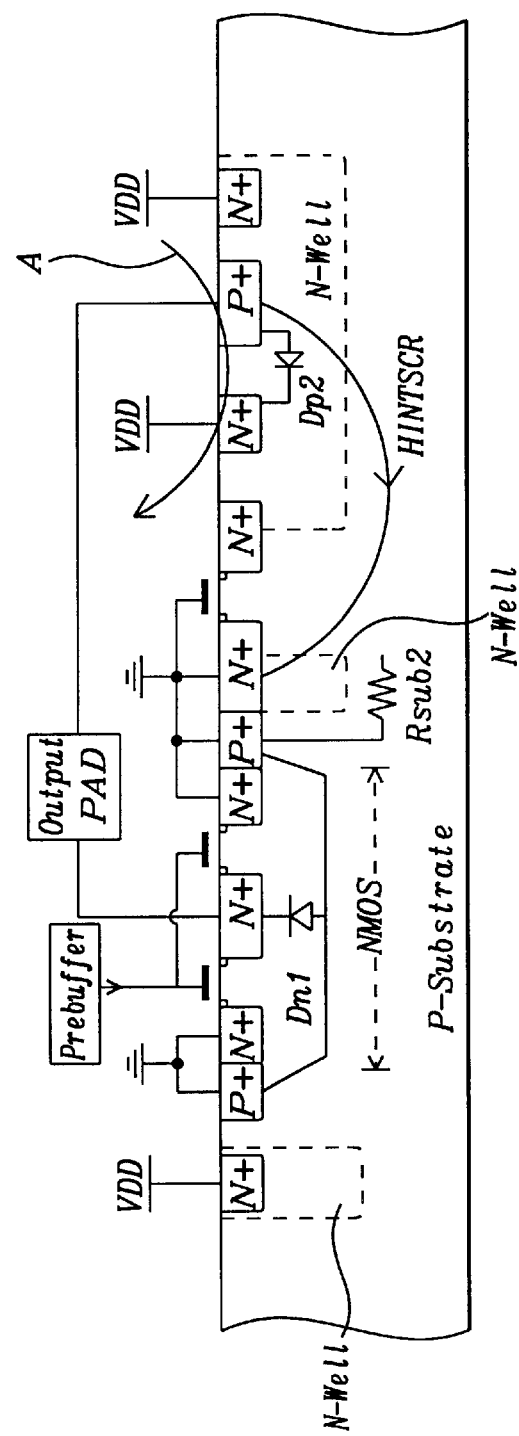
FIG. 4 – Prior Art

EMBEDDED SCR PROTECTION DEVICE FOR OUTPUT AND INPUT PAD

This is a division of patent application Ser. No. 09/671,214, filing date Sep. 28, 2000 now U.S. Pat. No. 6,492,208, Embedded Scr Protection Device For Output and Input Pad, assigned to the same assignee as the present invention.

BACKGROUND OF THE INVENTION

1. Field of the Invention

The invention relates to the protection of integrated circuits from electrostatic discharge (ESD), and more particularly to the protection of NMOS transistors by an embedded parasitic silicon controlled rectifier (SCR) which triggers at a very low voltage.

2. Description of the Related Art

The protection of integrated circuits from electrostatic discharge (ESD) is a subject which has received a lot of attention from circuit designers because of the serious damage that ESD can wreak as device dimensions are reduced. Workers in the field and inventors have proposed many solutions, many trying to solve the problem of protecting sub-micron (1 micron=$10^{-6}$ meter) devices while still allowing them to function unencumbered and without undue, or zero, increase of silicon real estate. The main thrust of ESD protection for MOS devices is focused on the use of parasitic npn and pnp bipolar transistors, which together form a silicon controlled rectifier (SCR). Unwanted as this SCR normally is, it can safely discharge dangerous ESD voltages as long as its trigger voltage is low enough to prevent gate oxide breakdown of the MOS devices of which it is a part.

Among ESD protection devices SCR protection shows good clamping capability (a very low holding voltage) compared to Gated-NMOS, however, a larger trigger voltage and latch-up concerns are always the drawbacks. See below a discussion of the graph of FIG. 1. In the sub-micron technologies, the Gated-NMOS is mostly used for a robust ESD design. A problem exists for the 0.15 micron process because the Gated-NMOS snapback voltage (larger than 5 volt) is higher than the gate oxide breakdown of 10 Million volt/cm. For 0.6 and 0.5 micron high voltage technology, the Gated-NMOS will generally show its weakness on high voltage (12 volt, 40 volt) ESD due to higher drain junction breakdown and higher snapback voltage.

The following publications describe low voltage lateral SCR structures to protect the input and output circuitry of an integrated circuit during an ESD event:

"A Low-Voltage Triggering SCR for On-Chip ESD Protection at Output and Input Pads," A. Chatterjee and T. Polgreen, IEEE Electron Device Letters, Vol. 12, No. 1, January, 1991.

"Lateral SCR Devices with Low-Voltage High-Current Triggering Characteristics for Output ESD Protection in Submicron CMOS Technology," Ker, IEEE Transactions On Electron Devices, Vol.45, No.4, April 1998, pp.849–860.

FIG. 1 is a graph of the I–V characteristics of a 0.15 micron process SCR/Gated-NMOS device. Curve 1 (dotted line) shows the characteristics for the SCR and Curve 2 (solid line) shows the characteristics for the Gated-NMOS. It is obvious that the SCR has the lower holding voltage while the Gated-NMOS has the lower trigger voltage. Another drawback of the SCR's is the latch-up concern.

We now describe in FIG. 2 a prior art low-trigger SCR for on chip ESD (IEEE, Electron Device Letters, Vol. 12, No. 1, January, 1991, see reference above). In a substrate 21 is embedded an n-well 32. Also implanted in substrate 21 is gated NMOS T1, comprising n+ drain 22, gate 23, and n+ source 24. Implanted next to n+ source 24 is p+ diffusion 25. Implants 23, 24 and 25 are tied to a voltage reference 39 (typically ground). N+ drain 22 is connected to chip pad 38. Implanted in the n-well are n+ diffusion 26 and p+ diffusion 27 which also are connected to chip pad 38. Halfway straddling the n-well is n+ diffusion 28 which is the drain of gated NMOS T2. T2 further comprises gate 29 and n+ diffusion (source) 30. A p+ diffusion 31 is implanted next to n+ diffusion 30. 29, 30, and 31 are connected to 39. Therefore, both T1 and T2 are grounded gate NMOS transistors. 26, 27, 28, 30, 31, and 32 make up the external SCR (external because the SCR is largely external to the gated NMOS transistors T1, T3, and T4). The latter two transistors are not further described since they follow the pattern of T1. The SCR itself comprises a parasitic bipolar pnp transistor Q1 and a parasitic bipolar npn transistor Q2. Drawbacks of this layout are a) the external SCR and b) low current capacity resulting in poor protection efficiency.

FIG. 3 is a schematic diagram of the layout of FIG. 2 where the same numbers indicates the same items.

Another prior art lateral low-voltage, high-current SCR (IEEE Transactions On Electron Devices, Vol.45, No.4, April 1998, see reference above) is shown in FIG. 4 which is described in the cited IEEE document on page 851. Drawbacks of this design are:

a) poor I/O and VDD/GND connections causing latch-up concerns, b) the SCR is still outside of the main protection area leading to poor efficiency. Latchup occurred, see Arrow A, at a voltage difference of larger than 0.7 volt caused by diode Dp2 because of P-N diode forward cut-in.

Other related art is described in the following U.S. patents:

U.S. Pat. No. 5,872,379 (Lee) describes a low voltage turn-on SCR to provide protection to the input and output circuitry of an integrated circuit during an ESD event.

U.S. Pat. No. 5,907,462 (Chatterjee et. al) teaches a gate coupled SCR, where the stress voltage is coupled from a pad to a gate electrode causing a NMOS transistor to conduct, thus triggering the SCR.

U.S. Pat. No. 5,939,756 (Lee) discloses an added P-well implantation for uniform current distribution during an ESD event to provide improved protection to the input and output circuitry of an integrated circuit.

It should be noted that none of the above-cited examples of the related art show part of the drain and the p+ diffusion in the n-well, nor having the drain connection tightly tied together at the p+ diffusion and the n+ drain as in the presently disclosed invention.

SUMMARY OF THE INVENTION

It is an object of the present invention to provide circuits and methods for an embedded SCR implemented in either 5 volt or 12 volt I/O devices.

Another object of the present invention is to provide for an embedded SCR which operates at less than or equal to 2 volts to prevent gate oxide damage, particularly in 0.15 micron 5 volt technology.

A further object of the present invention is to provide for an embedded SCR where the ESD pass voltage of 8,000 volt is achieved for the 12 volt process.

Yet another object of the present invention is to provide a latch-up free SCR.

These objects have been-achieved by inserting the p+ diffusion and the n-well in the drain side and a part of the drain to form a low-trigger, high efficiency SCR. Further, the layout is such that the drain connection is tightly tied together at the p+ diffusion and the n+ drain making that connection very short and thereby preventing latch-up. The parasitic SCR is made more efficient because it is entirely within the n+ diffusions (the source of the grounded gate NMOS transistor) at either side of the structure and, thus, called an embedded SCR. For the 12 volt I/O device the design is modified by placing each of two n+ drains in its own n-type doped drain (ndd) area and straddling halfway the n-well. The structure is repeated as required and a p+ diffusion is implanted at both perimeters and connected to the nearest n+ source and a reference voltage.

BRIEF DESCRIPTION OF THE DRAWINGS

FIG. 2 is a schematic cross-sectional view of a low-trigger SCR for on-chip ESD of the prior art.

FIG. 3 is an equivalent-circuit diagram of FIG. 2.

FIG. 4 is a schematic cross-sectional view of a second low-trigger SCR for on-chip ESD of the prior art.

DESCRIPTION OF THE PREFERRED EMBODIMENT

Figure 8:
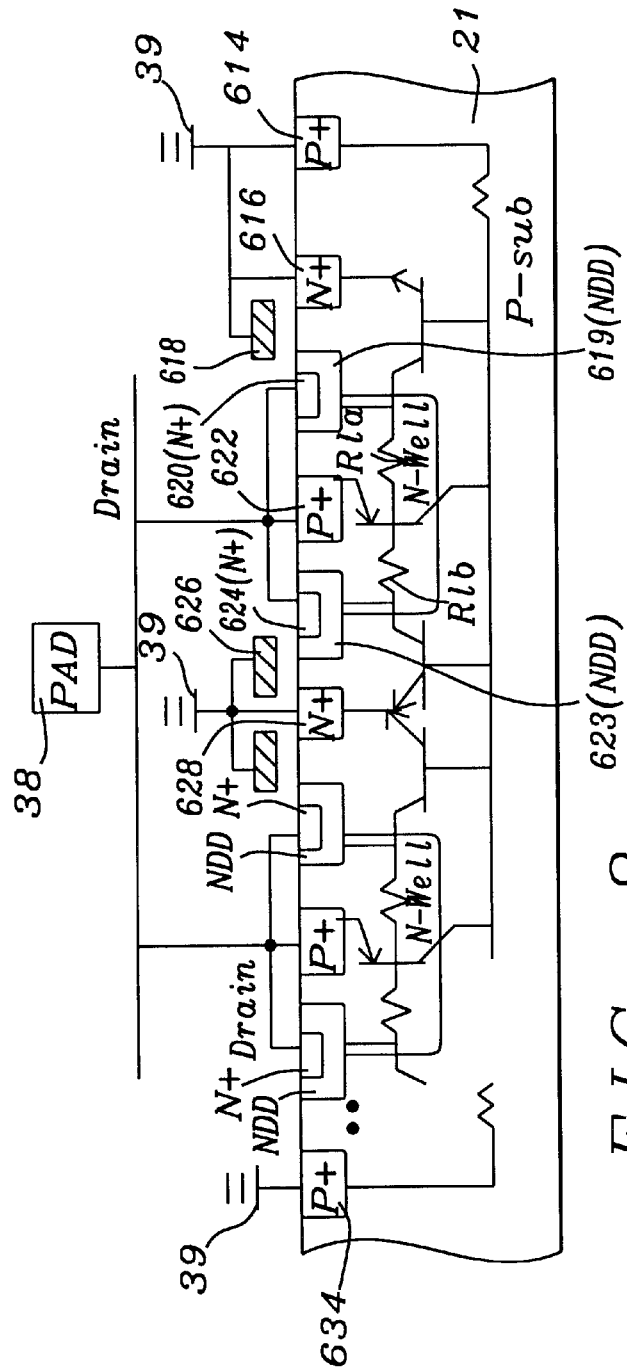
FIG. 8 is the schematic cross-sectional view of FIG. 5 of a second preferred embedded SCR for 12 Volt of the present invention.

The merits of electrostatic discharge (ESD) protection utilizing a parasitic silicon controlled rectifier (SCR) are good clamping capability compared to a gated-NMOS device. Drawbacks are the larger trigger voltage and latch-up concerns. The present invention avoids these shortcomings by using an embedded SCR which provides a low trigger, latch-up free, and highly efficient ESD protection. Key elements of the present invention are a) the insertion of the P+ diffusion and the N-well in the drain side where the N-well partially overlaps the drain, and b) tying together the drain at the P+ diffusion and the N+ drain. The embedded SCR is implemented in either a 5 Volt (FIG. 6) or a 12 Volt device (FIG. 8).

Figure 1:
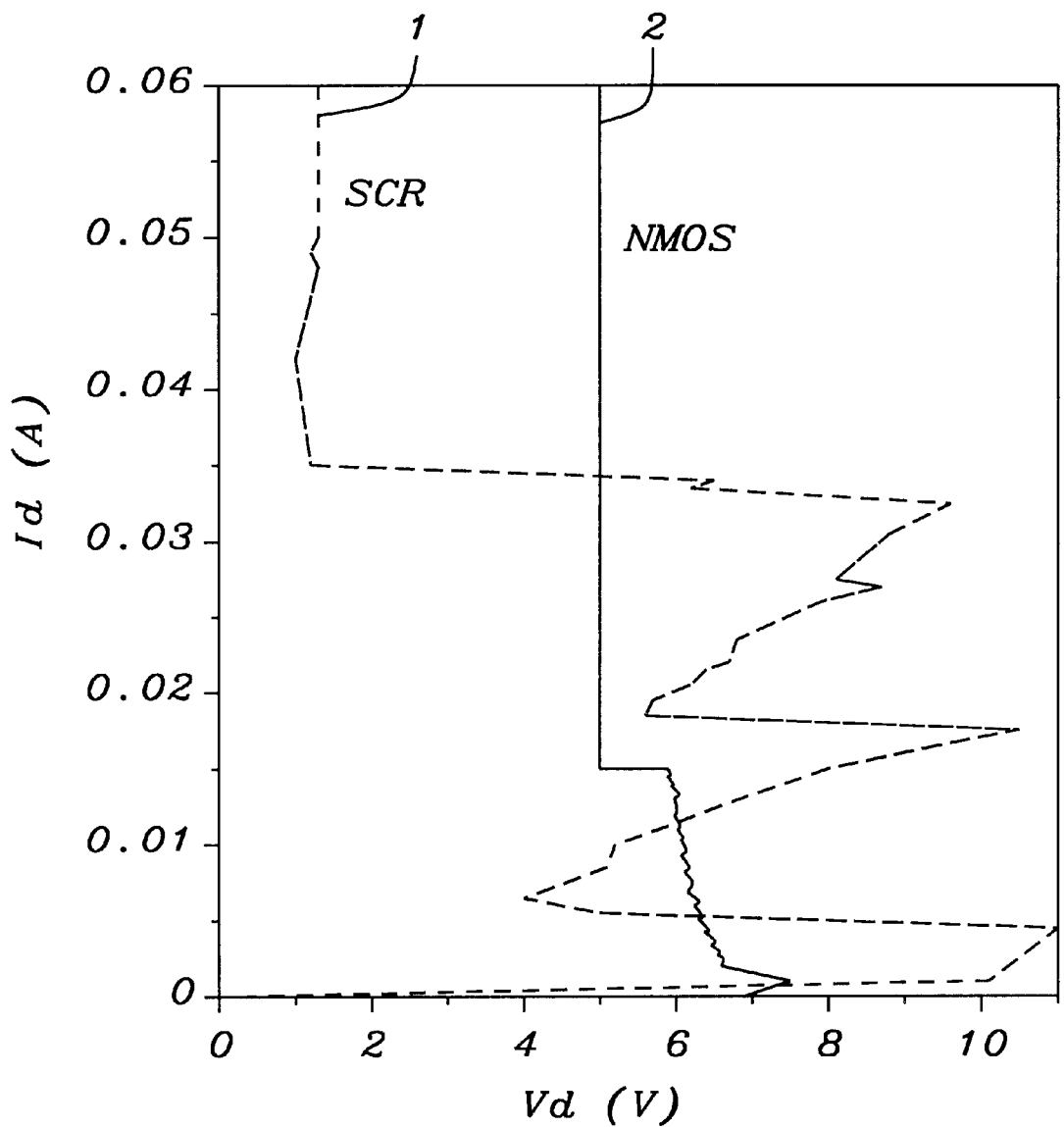
FIG. 1 is a graph of the SCR/gated NMOS I–V characteristics for a 0.15 um process.
Figure 5:
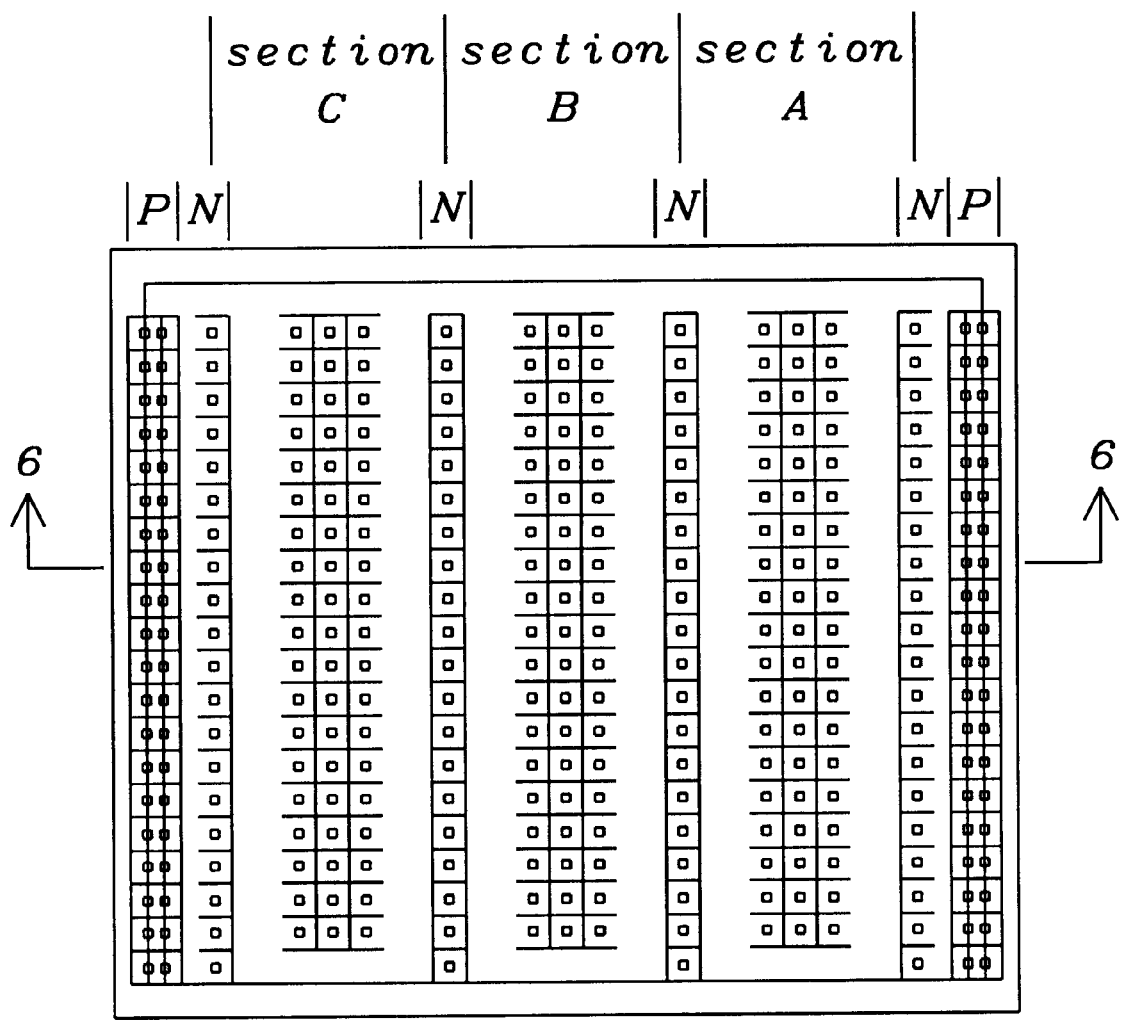
FIG. 5 is a layout example of an embedded SCR ESD protection of the present invention.

In FIG. 5, we show a top view of a section of a chip utilizing the design of the present invention. Sections A, B, and C designate three columns (of 19 rows each) of embedded protection SCR devices. Sections A, B, and C, having three boxes, indicate the drain area. Sections N with single boxes indicate the N+ sources. Note that the two N sections with single boxes in the middle are shared by A and B, and B and C, respectively. Sections P at either end represent P+ diffusions which are tied to a reference voltage. It must be understood that in the illustrated embodiment, the invention is shown by way of illustration and not of limitation, i.e., the number of sections and rows can be varied to suit the particular application.

Figure 6:
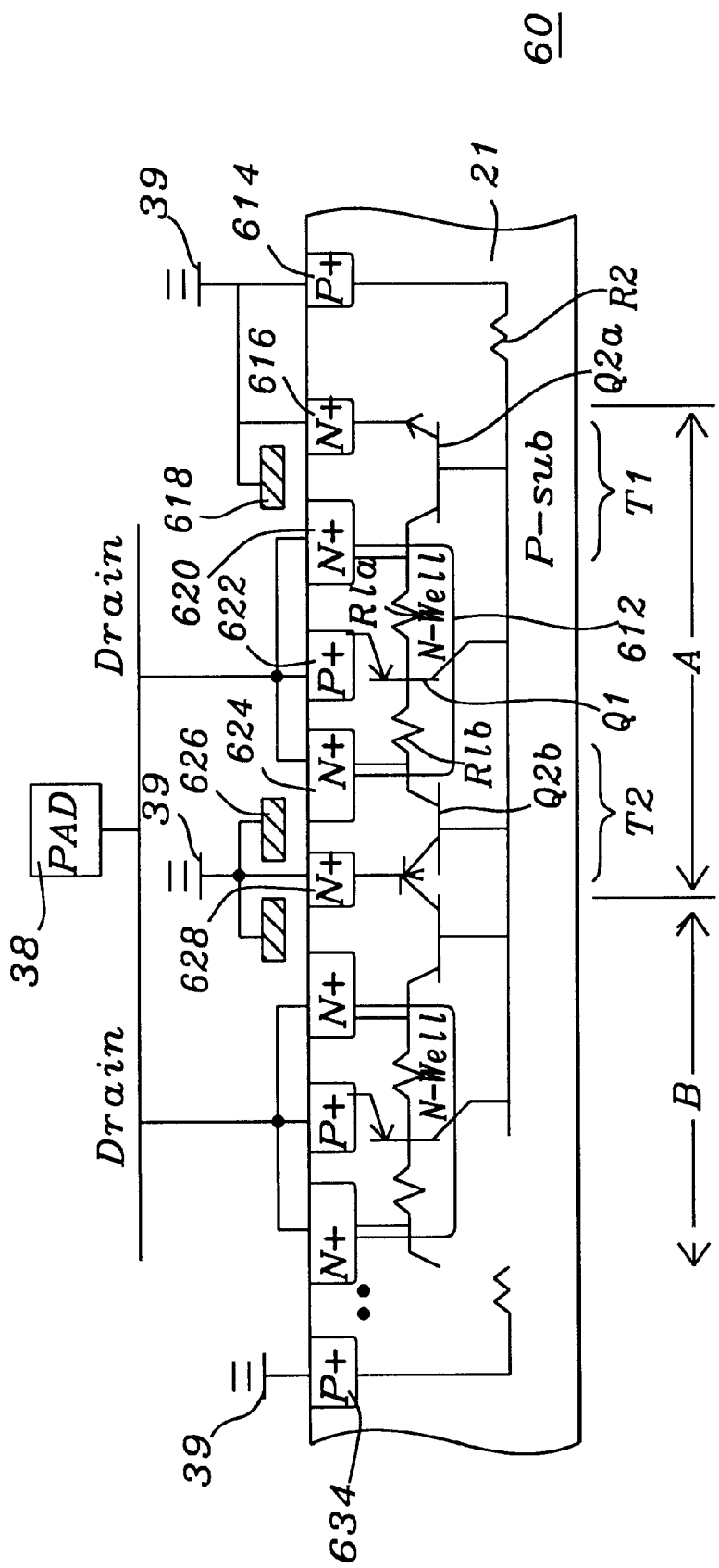
FIG. 6 is the schematic cross-sectional view of FIG. 5 of a first preferred embedded SCR for 5 Volt of the present invention.

FIG. 6, the, partial view of the cross-section 6—6 of FIG. 5, is a schematic detailed layout of the first preferred embodiment of the present invention for a 5 volt I/O device. Section A and B of FIG. 6 represent sections A and B of FIG. 5, respectively. In FIG. 6, section B is only partially shown but is a repeat of section A.

Still referring to FIG. 6, the embedded SCR protection device 60 for an output and input pad of an n-channel transistor circuit comprises a semiconductor wafer (not shown) with a p-substrate 21. The same numerals in FIG. 2 to FIG. 6 designate the same components. Implanted in p-substrate 21 are a first n+ and a second n+ diffusion 616 and 628, respectively, which are the source of a first and a second n-channel transistor T1 and T2. The first transistor T1 further comprises n+ drain 620. and polysilicon gate 618. The second transistor T2 further comprises n+ drain 624. and polysilicon gate 626. Gate 618 and source 616 are connected by conductive means to reference voltage 39. Gate 626 and source 628 are similarly connected to reference voltage 39. Between drains 620 and 624 is implanted a first p+ diffusion 622. Drains 620 and 624 and p+ diffusion 622 are all connected by conductive means to chip pad 38. An n-well 612 is implanted in p-substrate 21, n-well 612 extending from halfway under n+ drain 620 to halfway under n+ drain 624.

The above structure creates a parasitic silicon controlled rectifier S1, which is comprised of three parasitic bipolar transistors:

pnp transistor Q1, its emitter, base, and collector formed by first p+ diffusion 622, n-well 612, and p-substrate 21, respectively, npn transistor Q2a, its emitter, base, and collector formed by source 616, p-substrate 21, and drain 620, respectively, npn transistor Q2b, its emitter, base, and collector formed by source 628, p-substrate 21, and drain 624, respectively.

Resistors R1a and R1b from the base of transistor Q1 to drains 620 and 624, respectively, represent the parasitic resistance of n-well 612. Resistor R2 from p+diffusion 614 to the base of transistor Q2a represents the parasitic resistance of p-substrate 21.

The above described structure between first and second n+ diffusions 616 and 628 (and including the SCR S1) is repeated a plurality of times depending on requirements. The above repeated structure further comprises a second p+ diffusion 614 embedded at one perimeter of the above structure and a third p+ diffusion 634 embedded a the other perimeter of the above structure. Both second and third p+ diffusions are connected to reference voltage 39 through conductive means.

SCR S1 is called an embedded SCR because all parasitic bipolar transistors are fully connected within the space defined by the first (616) and second n+diffusion (628). Because the SCR is embedded, the SCR trigger voltage is equal to or less than 2 volt and protects the transistor circuit from electrostatic discharge, particularly in 0.15 micron (1 micron=$10^{-6}$ meter) 5 volt technology. Because the coupling of the drains 620 and 624 to the chip pad 38 is very short—because of the close proximity of the drains to the p+ diffusion 622—the SCR is much more latch-up free than the parasitic SCRs of the prior art.

Figure 7:
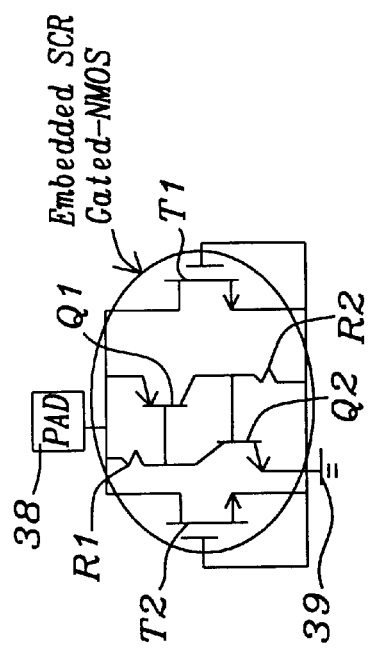
FIG. 7 is an equivalent-circuit diagram of FIG. 6 and FIG. 8.

FIG. 7 is a schematic circuit diagram of the structure of FIG. 6, where the same numeral indicates the same component. Transistor Q2 represents the two transistors Q2a and Q2b in parallel. Similarly the parasitic resistors R1a and R1b are represented by resistor R1.

A second preferred embodiment of the present invention for a 12 volt I/O device is depicted in FIG. 8. Again, the same numbers in FIG. 6 and FIG. 8 identify the same components. Drains 624 and 620 are each implanted in an n-type doped drain (ndd) area 619 and 623, respectively; all other structures are identical. The structure with ndd areas 619 and 623 is preferred for 12 volt circuits and protects the transistor circuit from electrostatic discharge voltages of up to 8,000 volt. The embedded SCR S1 prevents gate oxide damage in 0.15 micron 5 volt and 12 volt technology transistors. For either of the two preferred embodiments the embedded SCR is the reason for the low snapback voltage of equal or less than 2 volt and, thus for preventing gate oxide breakdown. FIG. 7 also serves as the schematic circuit diagram for FIG. 8.

Experiments conducted with the circuit of the invention are tabulated in Table 1. Table 1 shows that the Human Body Model (HBM) ESD Passing Voltage is 1 to about 1.5 KV for the conventional gated-NMOS device but increased to about 8 KV for the second preferred embodiment of the invention.

TABLE 1

| Protection Device (1.0 micron 12 volt process) | ESD Pass Threshold (Industry Spec: 2 KV) |
|---|---|
| Conventional Gated-NMOS | 1~1.5 KV (Fail) |
| Embedded SCR structure | ~8 KV (Pass) |

Figure 9:
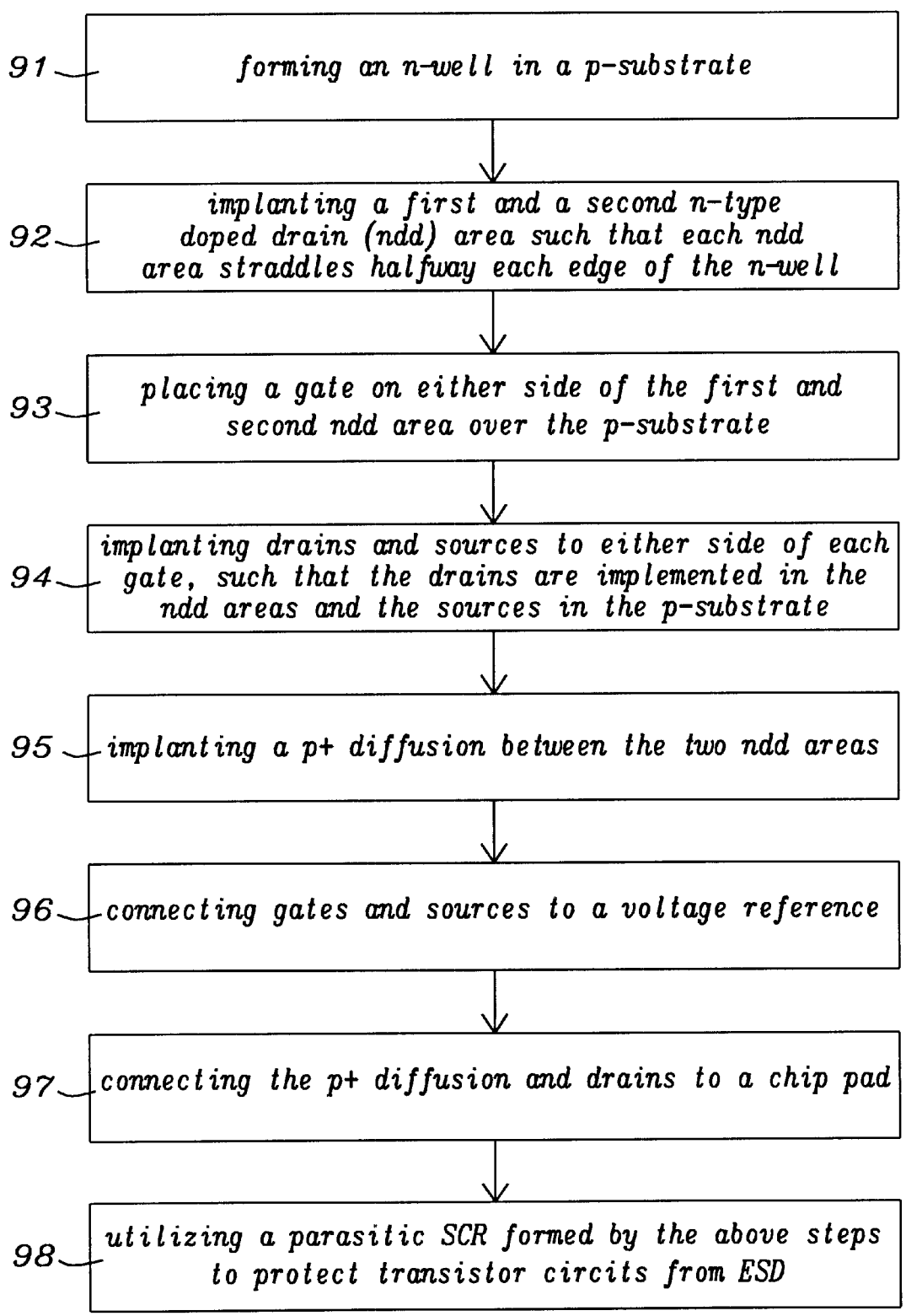
FIG. 9 is a block diagram of the method of the present invention.

We now discuss the second preferred method of this invention by reference to FIG. 9:

BLOCK 91 shows forming an n-well in a p-substrate.
BLOCK 92 shows implanting a first and a second n-type doped drain (ndd) area such that each ndd area straddles halfway each edge of the n-well.
BLOCK 93 shows placing a gate on either side of each ndd area.
BLOCK 94 shows implanting drains and sources to either side of each gate, such that the drains are implanted in the ndd areas and the sources are implanted in the p-substrate.
BLOCK 95 shows implanting a p+ diffusion between the two ndd areas of the n-well, where the p+ diffusion is in close proximity to the ndd areas.
BLOCK 96 shows connecting gates and sources to a voltage reference.
BLOCK 97 shows connecting the p+ diffusion and drains to a chip pad.
BLOCK 98 shows utilizing a parasitic SCR formed by the above steps to protect transistor circuits from ESD.

In a first preferred method of the present invention the implanting of the two ndd areas is omitted and the drains are implanted in such a way as to straddle the n-well. This embodiment is simpler and is suitable for 0.15 micron 5 volt technology. The embedded parasitic SCR together with the ndd areas in the second preferred method protects 1.0 micron 12 volt technology transistors from electrostatic discharge voltages of up to 8,000 volt. In either of the two preferred methods the embedded SCR results in the low snapback voltage of equal or less than 2 volt and in preventing gate oxide breakdown.

While the invention has been particularly shown and described with reference to the preferred embodiments thereof, it will be understood by those skilled in the art that various changes in form and details may be made without departing from the spirit and scope of the invention.

What is claimed is:

1. An embedded SCR protection device for an output and input pad of an n-channel transistor circuit, comprising:

a semiconductor wafer with a p-substrate;
a first n+ and a second n+ diffusion implanted in said p-substrate, said first and said second n+ diffusion providing a first and a second n+ source, respectively;
a first n-channel transistor comprising said first n+ source, a first n+ drain, and a first polysilicon gate;
said first polysilicon gate disposed above the space separating said first n+ source and said first n+ drain;
said first polysilicon gate and said first n+ source connected by conductive means to a reference voltage;
a second n-channel transistor comprising said second n+ source, a second n+ drain, and a second polysilicon gate;
said second polysilicon gate disposed above the space separating said second n+ source and said second n+ drain;
said second polysilicon gate and said second n+ source connected by conductive means to said reference voltage;
said first and said second n+ drain implanted between said first and said second n+ source;
a first p+ diffusion implanted between said first and said second n+ drain in close proximity to each other;
said first p+ diffusion and said first and said second n+ drain all connected by conductive means to a chip pad;
an n-well implanted in said p-substrate, said n-well extending from halfway under said first n+ drain to halfway under said second n+ drain;
a parasitic silicon controlled rectifier (SCR), further comprising:
a parasitic pnp bipolar transistor, having an emitter, a base, and a collector, said emitter, said base, and said collector of said parasitic pnp bipolar transistor formed by said first p+ diffusion, said n-well, and said p-substrate, respectively;
a first parasitic npn bipolar transistor, having an emitter, a base, and a collector, said emitter, said base, and said collector of said first parasitic npn bipolar transistor formed by said first n+ source, said p-substrate, and said first n+ drain, respectively;
a second parasitic npn bipolar transistor, having an emitter, a base, and a collector, said emitter, said base, and said collector of said second parasitic npn bipolar transistor formed by said second n+ source, said p-substrate, and said second n+ drain, respectively;
above described structure between said first and said second n+ diffusion repeated a plurality of times;
a second p+ diffusion embedded a the left perimeter of said above described structure, said second p+ diffusion connected to said reference voltage through conductive means; and
a third p+ diffusion embedded a the right perimeter of said above described structure, said third p+ diffusion connected to said reference voltage through conductive means.

2. The protection device of claim 1, wherein said SCR has a snapback voltage of less than 2 Volt.

3. The protection device of claim 1, wherein said SCR is latch-up free because said connections to said chip pad are in close proximity.

4. The protection device of claim 1, wherein said SCR is an embedded SCR by virtue of all of its components being fully connected within the space defined by said drains of said n-channel transistors.

5. The protection device of claim 4, wherein said embedded SCR prevents gate oxide damage in 0.15 micron 5 volt technology transistors.

6. An embedded SCR protection device for an output and input pad of an n-channel transistor circuit, comprising:

a semiconductor wafer with a p-substrate;

a first n+ and a second n+ diffusion implanted in said p-substrate, said first and said second n+ diffusion providing a first and a second n+ source, respectively;

a first n-channel transistor comprising said first n+ source, a first n+ drain, and a first polysilicon gate;

said first polysilicon gate disposed above the space separating said first n+ source and said first n+ drain;

said first polysilicon gate and said first n+ source connected by conductive means to a reference voltage;

a second n-channel transistor comprising said second n+ source, a second n+ drain, and a second polysilicon gate;

said second polysilicon gate disposed above the space separating said second n+ source and said second n+ drain;

said second polysilicon gate and said second n+ source connected by conductive means to said reference voltage;

said first and said second n+ drain implanted between said first and said second n+ source;

said first and said second n+ drain implanted each in a first and a second n-type doped drain (ndd) area, respectively;

a first p+ diffusion implanted between said first and said second ndd area in close proximity to each other;

said first p+ diffusion and said first and said second n+ drain all connected by conductive means to a chip pad;

an n-well implanted in said p-substrate, said n-well extending from halfway under said first ndd area to halfway under said second ndd area;

a parasitic silicon controlled rectifier (SCR), further comprising:

a parasitic pnp bipolar transistor, having an emitter, a base, and a collector, said emitter, said base, and said collector of said parasitic pnp bipolar transistor formed by said first p+ diffusion, said n-well, and said p-substrate, respectively;

a first parasitic npn bipolar transistor, having an emitter, a base, and a collector, said emitter, said base, and said collector of said first parasitic npn bipolar transistor formed by said first n+ source, said p-substrate, and said first ndd area, respectively;

a second parasitic npn bipolar transistor, having an emitter, a base, and a collector, said emitter, said base, and said collector of said second parasitic npn bipolar transistor formed by said second n+ source, said p-substrate, and said second ndd area, respectively;

above described structure between said first and said second n+ diffusion repeated a plurality of times;

a second p+ diffusion embedded a the left perimeter of said above described structure, said second p+ diffusion connected to said reference voltage through conductive means; and a third p+ diffusion embedded a the right perimeter of said above described structure, said third p+ diffusion connected to said reference voltage through conductive means.

7. The protection device of claim 6, wherein said SCR has a snapback voltage of less than 2 Volt.

8. The protection device of claim 6, wherein said SCR together with said ndd areas protects 1.0 micron 12 volt technology transistors from electrostatic discharge voltages of up to 8,000 volt.

9. The protection device of claim 6, wherein said SCR is latch-up free because said connections to said chip pad are in close proximity.

10. The protection device of claim 6, wherein said SCR is an embedded SCR by virtue of all of its components being fully connected within the space defined by said drains of said n-channel transistors.

11. The circuit of claim 10, wherein said embedded SCR prevents gate oxide damage in 0.15 micron 5 volt technology transistors.

* * * * *